(12) United States Patent
Lin et al.

(10) Patent No.: US 10,629,511 B2
(45) Date of Patent: Apr. 21, 2020

(54) HEAT DISSIPATION SUBSTRATE, MANUFACTURING METHOD THEREOF AND CHIP PACKAGE STRUCTURE

(71) Applicant: Unimicron Technology Corp., Taoyuan (TW)

(72) Inventors: Chien-Chen Lin, Taoyuan (TW); Tzu-Hsuan Wang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/133,711

(22) Filed: Sep. 18, 2018

(65) Prior Publication Data

US 2020/0051885 A1 Feb. 13, 2020

(30) Foreign Application Priority Data

Aug. 9, 2018 (TW) .............................. 107127771 A

(51) Int. Cl.
| | |
|---|---|
| *H01L 23/34* | (2006.01) |
| *H01L 21/00* | (2006.01) |
| *H01L 23/367* | (2006.01) |
| *H01L 21/768* | (2006.01) |
| *H01L 23/373* | (2006.01) |
| *H01L 23/538* | (2006.01) |
| *H01L 23/522* | (2006.01) |

(52) U.S. Cl.
CPC ...... *H01L 23/367* (2013.01); *H01L 21/76816* (2013.01); *H01L 21/76877* (2013.01); *H01L 23/3735* (2013.01); *H01L 23/5226* (2013.01); *H01L 23/5383* (2013.01)

(58) Field of Classification Search
CPC ......... H01L 21/76816; H01L 21/76877; H01L 23/3735; H01L 23/5226; H01L 23/5383
USPC ............................................ 257/712; 438/49
See application file for complete search history.

(56) References Cited

U.S. PATENT DOCUMENTS

| | | | | |
|---|---|---|---|---|
| 2014/0251658 | A1* | 9/2014 | Lin ...................... | H05K 1/0206 174/252 |
| 2015/0115416 | A1* | 4/2015 | Costa .................. | H01L 23/3737 257/632 |

(Continued)

FOREIGN PATENT DOCUMENTS

| | | |
|---|---|---|
| JP | 2009231511 | 10/2009 |
| TW | M256585 | 2/2005 |

*Primary Examiner* — David S Blum
(74) *Attorney, Agent, or Firm* — JCIPRNET

(57) ABSTRACT

A heat dissipation substrate includes an inner circuit structure, a first build-up circuit structure and a heat dissipation channel. The first build-up circuit structure is disposed on the inner circuit structure, and includes an interlayer dielectric layer, a first dielectric layer, a first patterned conductive layer and a plurality of first conductive vias. The first patterned conductive layer and the first dielectric layer are sequentially stacked on the interlayer dielectric layer. The heat dissipation channel is disposed around the chip disposing area on the first build-up circuit structure and has a first opening and a second opening. The first opening penetrates through the first dielectric layer and exposes a portion of the interlayer dielectric layer. The second opening is disposed on a side surface of the first build-up circuit structure. The first opening is in communication with the second opening.

14 Claims, 8 Drawing Sheets

(56) References Cited

U.S. PATENT DOCUMENTS

2015/0115463 A1* 4/2015 Pelley .................. H01L 23/481
   257/774
2018/0308919 A1* 10/2018 Schuberth ............... H01L 28/10

* cited by examiner

HEAT DISSIPATION SUBSTRATE, MANUFACTURING METHOD THEREOF AND CHIP PACKAGE STRUCTURE

CROSS-REFERENCE TO RELATED APPLICATION

This application claims the priority benefit of Taiwan application serial no. 107127771, filed on Aug. 9, 2018. The entirety of the above-mentioned patent application is hereby incorporated by reference herein and made a part of this specification.

BACKGROUND OF THE DISCLOSURE

Technical Field

The disclosure relates to a substrate, a manufacturing method thereof, and a package structure, and more particularly to a heat dissipation substrate, a manufacturing method thereof, and a chip package structure.

Background

Currently, in order to be in line with the trend of slimness and multi-function, circuit substrate of electronic products tends to be designed in the manner that a plurality of IC components are integrated within a limited area, causing that the heat energy generated during operation of the IC components cannot be dissipated immediately and is accumulated a lot in the IC component and circuit substrate; as a result, the operation efficiency of electronic product is affected. In view of the above, it is an issue for practitioners of the field to find out how to improve heat dissipation efficiency of substrate.

SUMMARY

The disclosure provides a heat dissipation substrate having a heat dissipation channel.

The disclosure provides a manufacturing method of a heat dissipation substrate, capable of manufacturing a heat dissipation substrate having a heat dissipation channel.

The disclosure provides a chip package structure, capable of improving the heat dissipation efficiency of the heat dissipation substrate.

The heat dissipation substrate of the disclosure includes an inner circuit structure, a first build-up circuit structure and at least one heat dissipation channel. The first build-up circuit structure is disposed on the inner circuit structure. The first build-up circuit structure includes an interlayer dielectric layer, at least one first dielectric layer, at least one first patterned conductive layer and a plurality of first conductive vias. The first conductive via penetrates through the interlayer dielectric layer and the first dielectric layer. The first patterned conductive layer and the first dielectric layer are sequentially stacked on the interlayer dielectric layer. The first patterned conductive layer is electrically connected to the inner circuit structure through the first conductive via. The heat dissipation channel is disposed around a chip disposing area on the first build-up circuit structure. The heat dissipation channel has a first opening and a second opening. The first opening penetrates through the first dielectric layer and exposes a portion of the interlayer dielectric layer. The second opening is disposed on a side surface of the first build-up circuit structure. The first opening is in communication with the second opening.

In an embodiment of the disclosure, the heat dissipation channel extends from a first surface of a first build-up circuit structure relatively far away from the inner circuit structure to a side surface of the first build-up circuit structure.

In an embodiment of the disclosure, the heat dissipation substrate further includes a first patterned solder resist layer. The first patterned solder resist layer is at least disposed on the first surface of the first build-up circuit structure relatively far from the inner circuit structure.

In an embodiment of the disclosure, the inner circuit structure includes a core layer, a first patterned circuit layer, a second patterned circuit layer and at least one conductive via. The core layer has an upper surface and a lower surface opposite to each other. The first patterned circuit layer is disposed on the upper surface. The second patterned circuit layer is disposed on the lower surface. The conductive via connects the first patterned circuit layer and the second patterned circuit layer.

In an embodiment of the disclosure, the heat dissipation substrate further includes a second build-up circuit structure and a second patterned solder resist layer. The second build-up circuit structure is disposed on the lower surface of the core layer and covers the second patterned circuit layer. The second patterned solder resist layer is disposed on the second surface of the second build-up circuit structure relatively far away from the inner circuit structure.

In an embodiment of the disclosure, the second build-up circuit structure includes at least one second dielectric layer, at least one second patterned conductive layer, and at least one second conductive via. The second conductive via penetrates through the second dielectric layer. The second dielectric layer and the second patterned conductive layer are sequentially stacked on the lower surface of the core layer. The second patterned conductive layer is electrically connected to the second patterned circuit layer through the second conductive via.

A chip package structure of the disclosure includes the above-described heat dissipation substrate and a chip. The chip is disposed on the first build-up circuit structure of the heat dissipation substrate and disposed in the chip disposing area. The chip includes a plurality of solder balls. The chip is electrically connected to the first patterned conductive layer through the solder balls.

The manufacturing method of the heat dissipation substrate of the disclosure includes the following steps. First, an inner circuit structure is provided. Next, a build-up process is performed to laminate the first build-up circuit structure onto the inner circuit structure. Specifically, the first build-up circuit structure includes an interlayer dielectric layer, at least one first dielectric layer, at least one first patterned conductive layer, and a plurality of first conductive vias. The first conductive via penetrates through the interlayer dielectric layer and the first dielectric layer. The first patterned conductive layer and the first dielectric layer are sequentially stacked on the interlayer dielectric layer. The first patterned conductive layer is electrically connected to the first patterned circuit layer through the first conductive via. Finally, a portion of the first patterned conductive layer and the first conductive via are removed to form at least one heat dissipation channel. Specifically, the heat dissipation channel is disposed around the chip disposing area on the first build-up circuit structure. The heat dissipation channel has a first opening and a second opening. The first opening penetrates through the first dielectric layer and exposes a portion of the interlayer dielectric layer. The second opening is disposed on a side surface of the first build-up circuit structure. The first opening is in communication with the second opening.

In an embodiment of the disclosure, the step of removing a portion of the first patterned conductive layer and the first conductive via includes performing an etching process on a periphery of the chip disposing area.

In an embodiment of the disclosure, after performing the build-up process to laminate the first build-up circuit structure onto the inner circuit structure, the method further includes: forming the first patterned solder resist layer on at least the first surface of the first build-up circuit structure relatively far away from the inner circuit structure.

In an embodiment of the disclosure, the manufacturing method of the heat dissipation substrate further includes the following steps. When the build-up process is performed, the second build-up circuit structure is simultaneously laminated onto the second patterned circuit layer. A second patterned solder resist layer is formed on the second surface of the second build-up circuit structure relatively far away from the inner circuit structure.

Based on the above, according to the disclosure, in the heat dissipation substrate, the manufacturing method thereof and the chip package structure, the heat dissipation substrate includes the heat dissipation channel, and the heat dissipation channel is disposed around the chip disposing area. Specifically, the heat dissipation channel has the first opening and the second opening. The first opening penetrates through the first dielectric layer, the second opening is disposed on a side surface of the first build-up circuit structure, and the first opening is in communication with the second opening. The design makes the heat generated during the operation of the chip and the heat dissipation channel in the heat dissipation substrate generate a chimney effect, thereby improving the heat dissipation efficiency of the heat dissipation substrate.

To make the above features and advantages of the disclosure more comprehensible, embodiments accompanied with drawings are described in detail as follows.

DETAILED DESCRIPTION OF DISCLOSED EMBODIMENTS

Figure 1A:
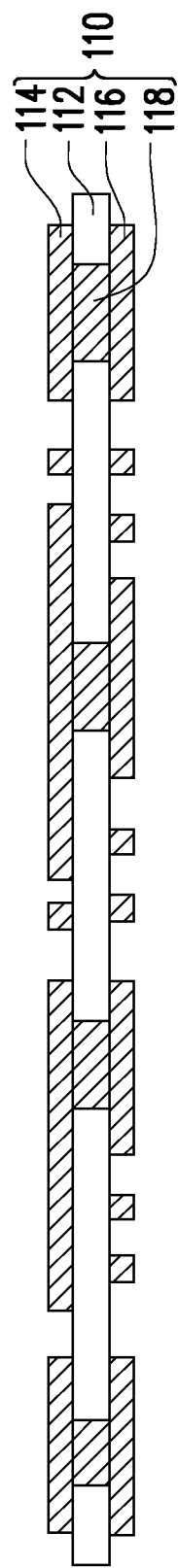
FIG. 1A-FIG. 1E are schematic cross-sectional views showing a manufacturing method of a heat dissipation substrate according to an embodiment of the disclosure.

FIG. 1A-FIG. 1E are schematic cross-sectional views showing a manufacturing method of a heat dissipation substrate according to an embodiment of the disclosure. Referring to FIG. 1A, in the embodiment, firstly, an inner circuit structure 110 is provided. The inner circuit structure 110 includes a core layer 112, a first patterned circuit layer 114, a second patterned circuit layer 116 and at least one conductive via 118 (shown schematically as four in FIG. 1A). The core layer 112 has an upper surface 112a and a lower surface 112b opposite to each other. The first patterned circuit layer 114 is disposed on the upper surface 112a. The second patterned circuit layer 116 is disposed on the lower surface 112b. The conductive via 118 connects the first patterned circuit layer 114 and the second patterned circuit layer 116. Here, the material of the first patterned circuit layer 114 and the material of the second patterned circuit layer 116 are, for example, copper, nickel, palladium, beryllium or a copper alloy thereof.

Figure 1B:
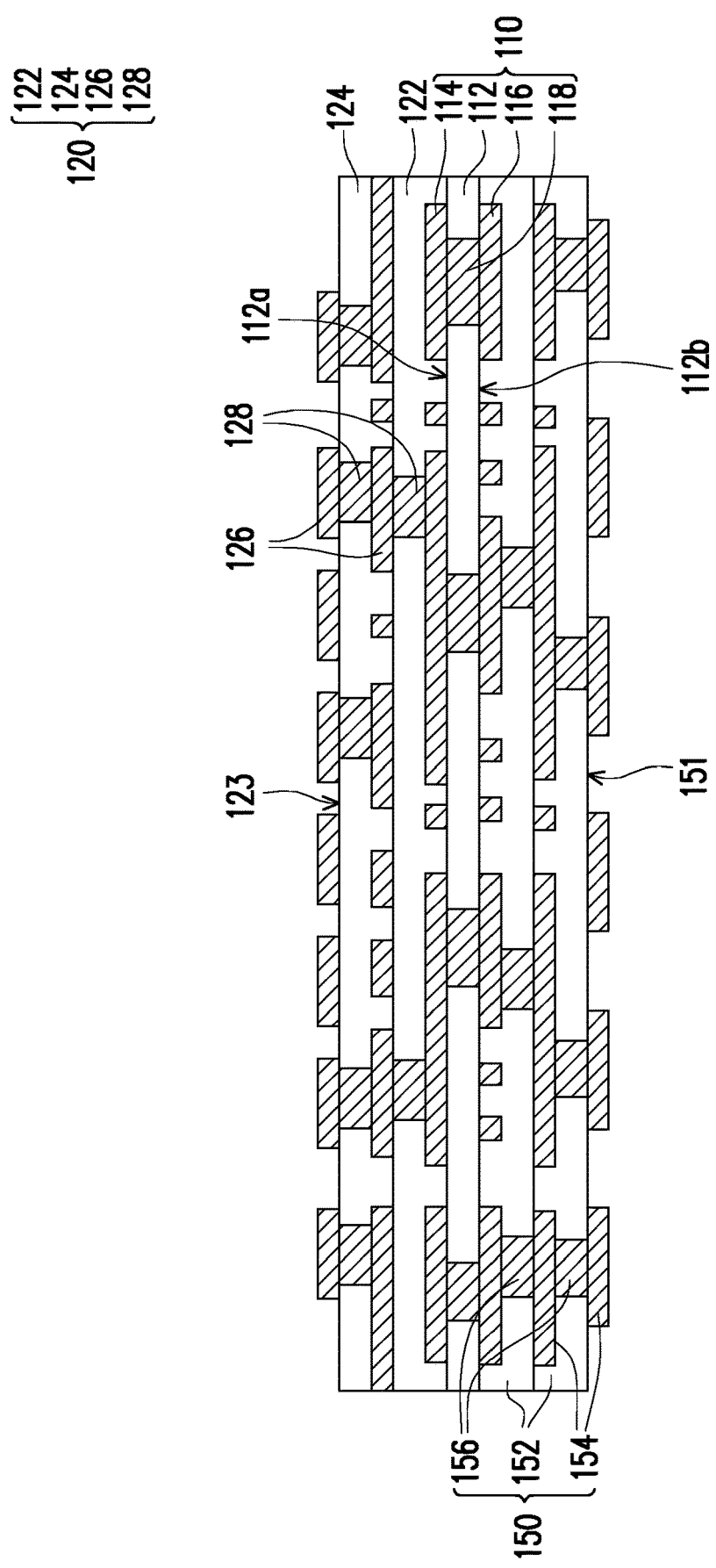

Next, referring to FIG. 1B, a build-up process is performed to laminate the first build-up circuit structure 120 onto the inner circuit structure 110. Specifically, the first build-up circuit structure 120 is disposed on the upper surface 112a of the core layer 112 and covers the first patterned circuit layer 114. The first build-up circuit structure 120 includes an interlayer dielectric layer 122, at least one first dielectric layer 124 (shown schematically as one layer in FIG. 1B), at least one first patterned conductive layer 126 (shown schematically as 2 layers in FIG. 1B) and a plurality of first conductive vias 128 (shown schematically as five in FIG. 1B). The first conductive via 128 penetrates through the interlayer dielectric layer 122 and the first dielectric layer 124. The first patterned conductive layer 126 and the first dielectric layer 124 are sequentially stacked on the interlayer dielectric layer 122. The first patterned conductive layer 126 is electrically connected to the first patterned circuit layer 114 of the inner circuit structure 110 through the first conductive via 128.

Then, referring to FIG. 1B, when the build-up process is performed, the second build-up circuit structure 150 is simultaneously laminated onto the second patterned circuit layer 116. Specifically, the second build-up circuit structure 150 is disposed on the lower surface 112b of the core layer 112 and covers the second patterned circuit layer 116. The second build-up circuit structure 150 includes at least one second dielectric layer 152 (shown schematically as two layers in FIG. 1B), at least one second patterned conductive layer 154 (shown schematically as two layers in FIG. 1B) and at least one second conductive via 156 (shown schematically as seven in FIG. 1B). The second conductive via 156 penetrates through the second dielectric layer 152. The second dielectric layer 152 and the second patterned conductive layer 154 are sequentially stacked on the lower surface 112b of the core layer 112. The second patterned conductive layer 154 is electrically connected to the second patterned circuit layer 116 through the second conductive via 156.

Figure 1C:
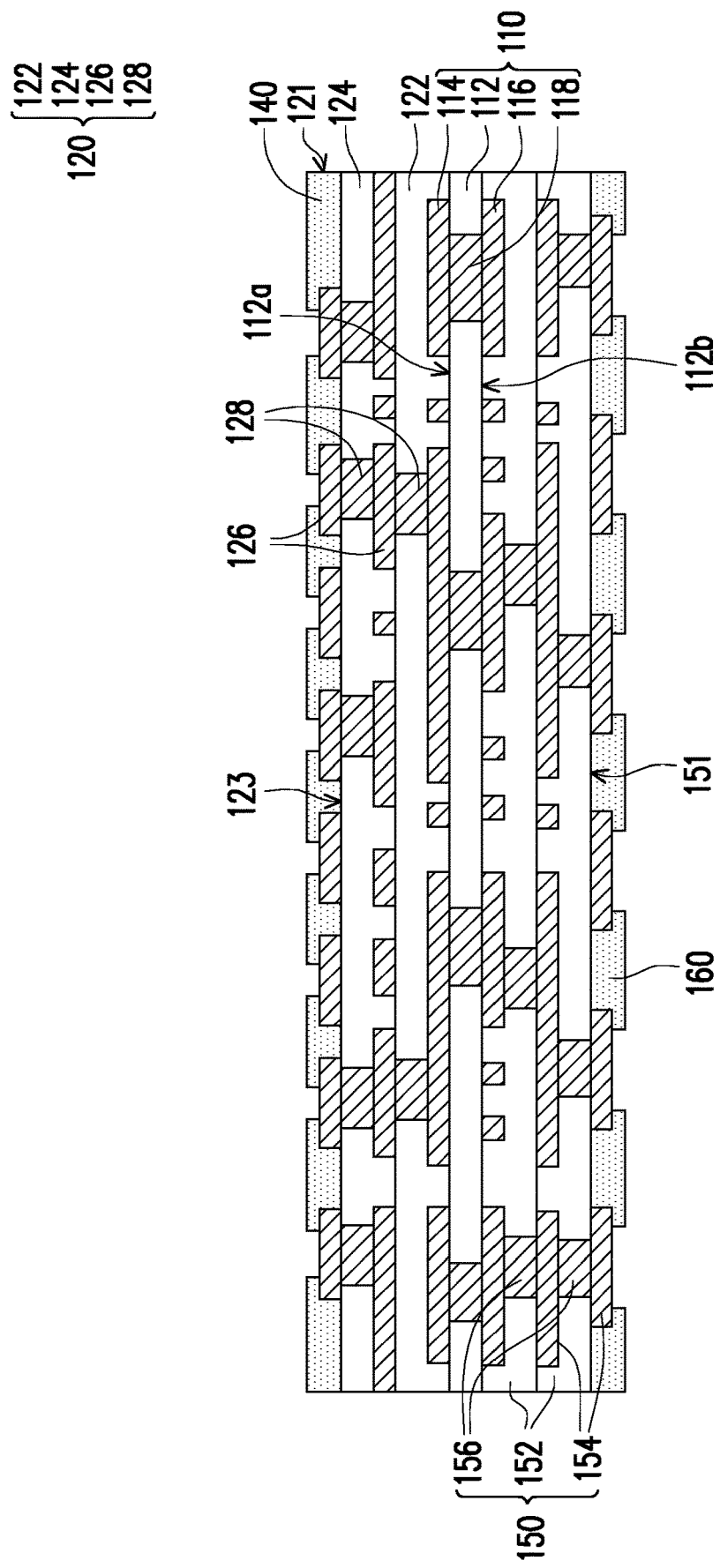
Figure 1D:
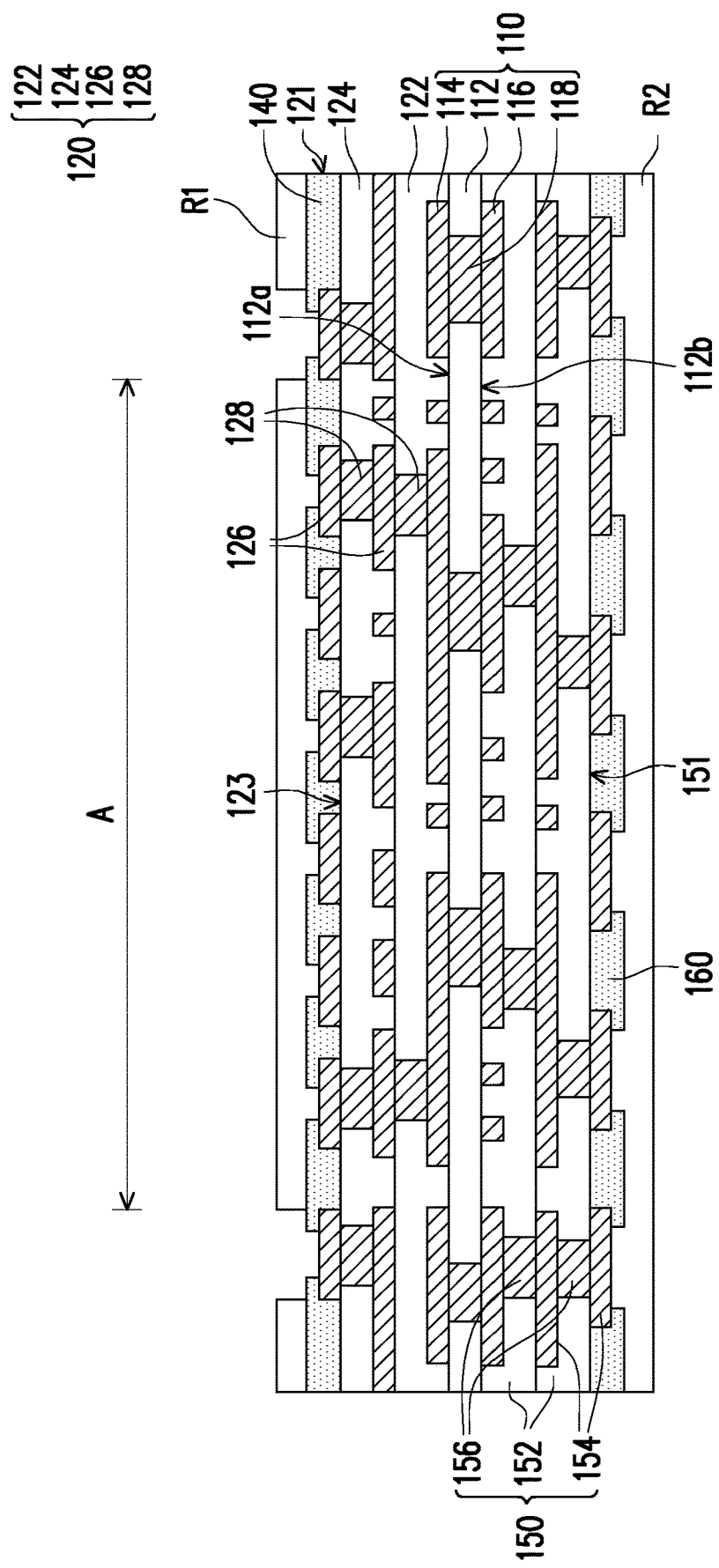

Then, referring to FIG. 1C, a first patterned solder resist layer 140 is formed on a first surface 123 of the first build-up circuit structure 120 relatively far away from the inner circuit structure 110. A second patterned solder resist layer 160 is formed on a second surface 151 of the second build-up circuit structure 150 relatively far away from the inner circuit structure 110. Specifically, the first patterned solder resist layer 140 covers the first dielectric layer 124 and exposes a portion of the first patterned conductive layer 126. The second patterned solder resist layer 160 covers the second dielectric layer 152 and exposes a portion of the second patterned conductive layer 154.

Figure 1E:
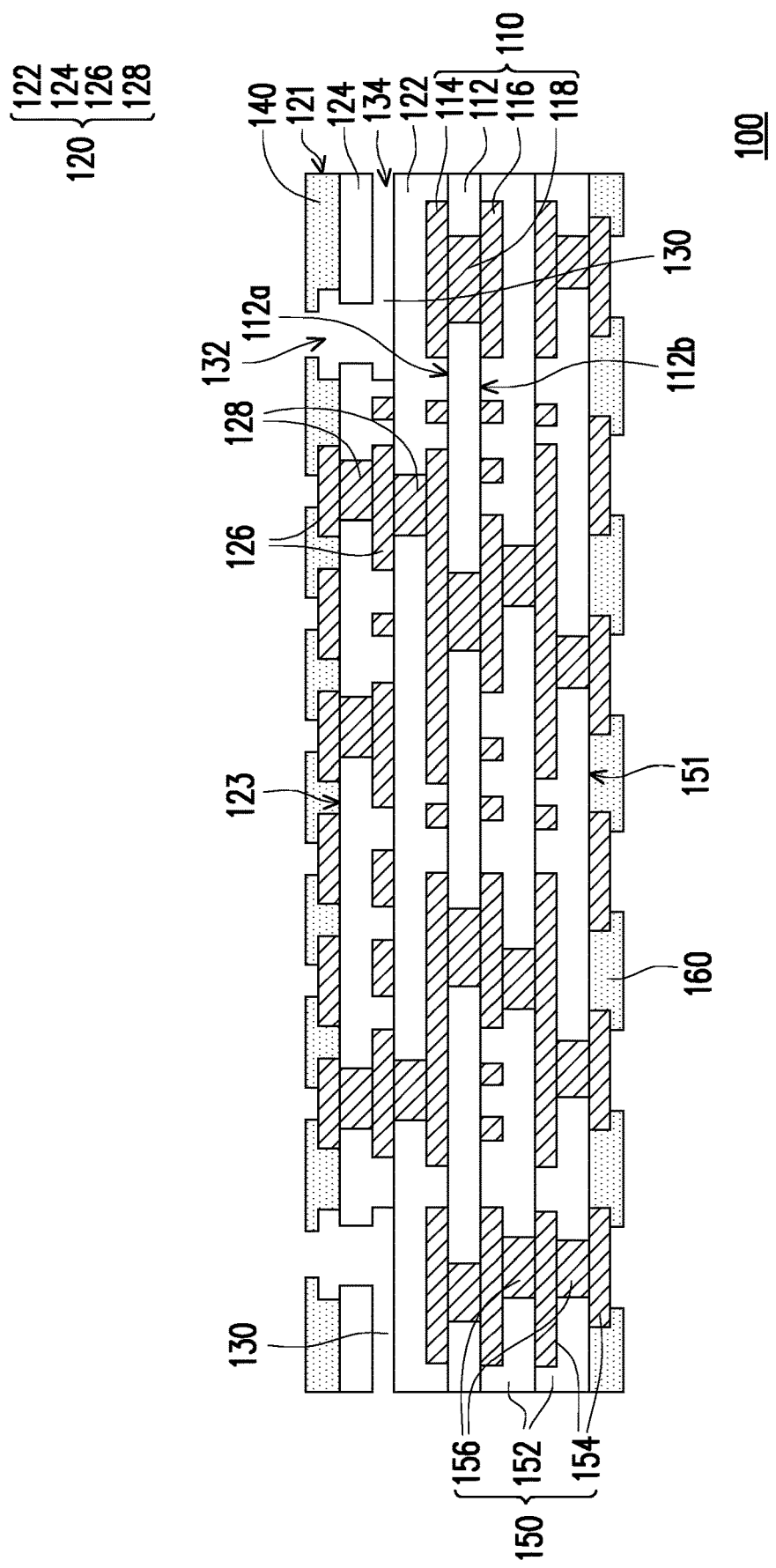

Then, referring to FIG. ID and FIG. 1E, a portion of the first patterned conductive layer 126 and the first conductive via 128 are removed to form at least one heat dissipation channel 130 (shown schematically as two in FIG. 1E). In the embodiment, the step of removing a portion of the first patterned conductive layer 126 and the first conductive via 128 to form the heat dissipation channel 130 is, for example, firstly, a first patterned photoresist layer R1 and a second patterned photoresist layer R2 are formed. Specifically, the first patterned photoresist layer R1 at least covers a chip disposing area A on the first build-up circuit structure 110 and exposes a portion of the first patterned conductive layer 126. The second patterned photoresist layer R2 completely covers the second patterned solder resist layer 160 and the second patterned conductive layer 154 that is furthest from the inner circuit structure 110. Next, an etching process is performed to the periphery of the chip disposing area A to remove a portion of the first patterned conductive layer 126 and the first conductive via 128, and a first opening 132 and a second opening 134 are formed. The first opening 132 penetrates through the first dielectric layer 124 and exposes a portion of the interlayer dielectric layer 122. The second opening 134 is disposed on the side surface 121 of the first build-up circuit structure 110 and located between the interlayer dielectric layer 122 and the first dielectric layer 124. Here, since the first opening 132 and the second opening 134 are in communication with each other, the heat dissipation channel 130 is formed. In other words, the heat dissipation channel 130 may extend from the first surface 123 of the first build-up circuit structure 120 relatively far away from the inner circuit structure 110 to the side surface 121 of the first build-up circuit structure 120. Finally, the first patterned photoresist layer R1 and the second patterned photoresist layer R2 are removed. At this time, fabrication of the heat dissipation substrate 100 is completed.

Based on the above, in the embodiment, the heat dissipation substrate 100 includes the inner circuit structure 110, the first build-up circuit structure 120 and at least one heat dissipation channel 130. The first build-up circuit structure 120 is disposed on the inner circuit structure 110. The first build-up circuit structure 120 includes the interlayer dielectric layer 122, the first dielectric layer 124, the first patterned conductive layer 126 and the first conductive via 128. The first conductive via 128 penetrates through the interlayer dielectric layer 122 and the first dielectric layer 124. The first patterned conductive layer 126 and the first dielectric layer 124 are sequentially stacked on the interlayer dielectric layer 122. The first patterned conductive layer 126 is electrically connected to the inner circuit structure 110 through the first conductive via 128. The heat dissipation channel 130 is disposed around the chip disposing area A on the first build-up circuit structure 120. The heat dissipation channel 130 has the first opening 132 and the second opening 134. The first opening 132 penetrates through the first dielectric layer 124 and exposes a portion of the interlayer dielectric layer 122. The second opening 134 is disposed on the side surface 121 of the first build-up circuit structure 120. The first opening 132 is in communication with the second opening 134.

It is to be explained that, the following embodiment has adopted component notations and part of the contents from the previous embodiment, wherein the same notations are used for representing the same or similar components, and descriptions of the same technical contents are omitted. The descriptions regarding the omitted part may be referred to the previous embodiments, and thus are not repeated herein.

Figure 2A:
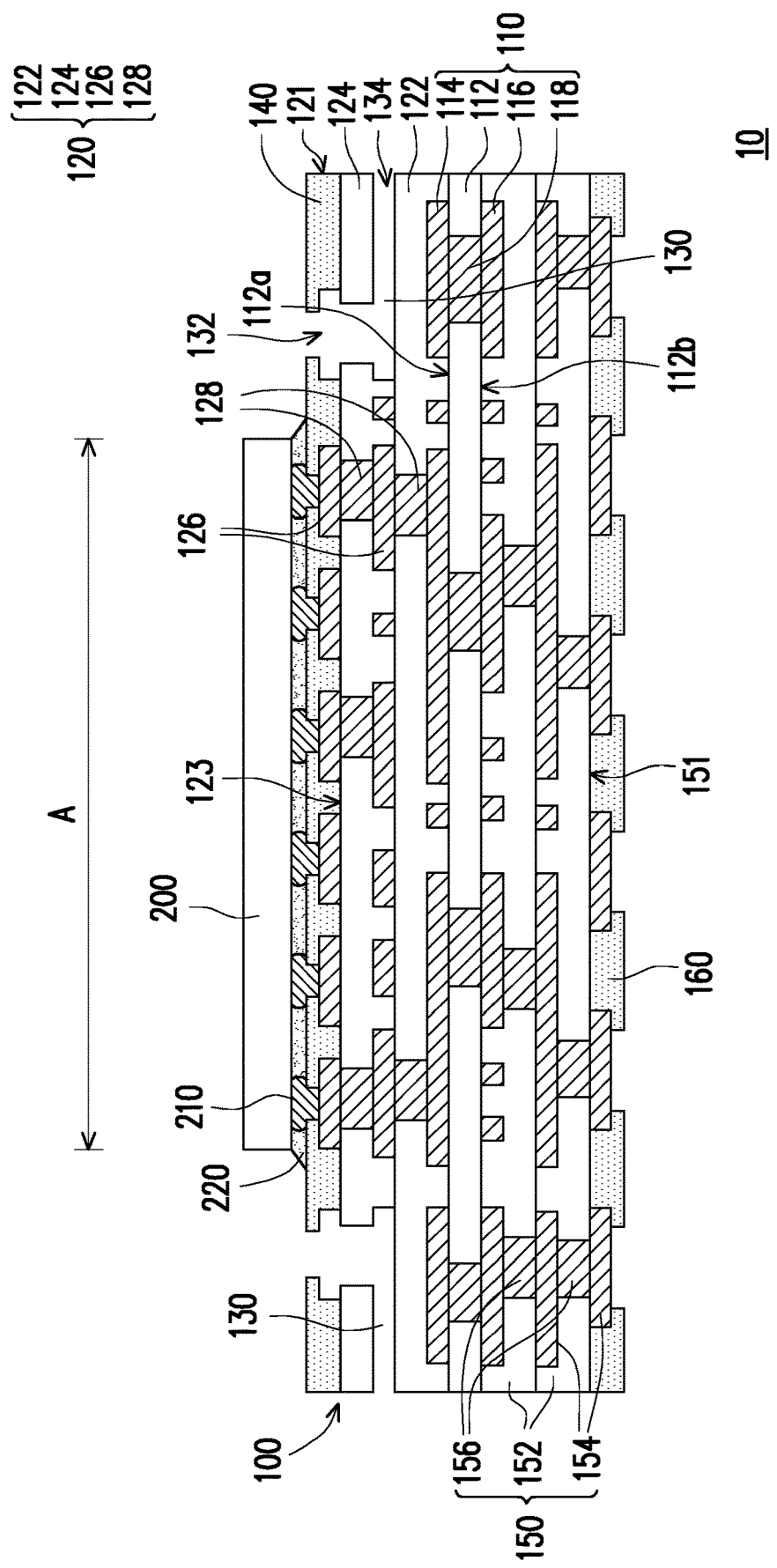
FIG. 2A is a schematic cross-sectional view showing a chip package structure according to an embodiment of the disclosure.
Figure 2B:
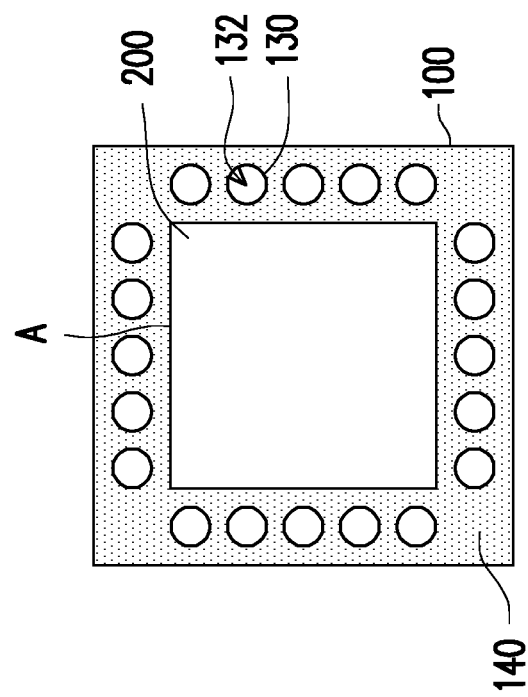
FIG. 2B is a schematic top view of the chip package structure in FIG. 2A.
Figure 2C:
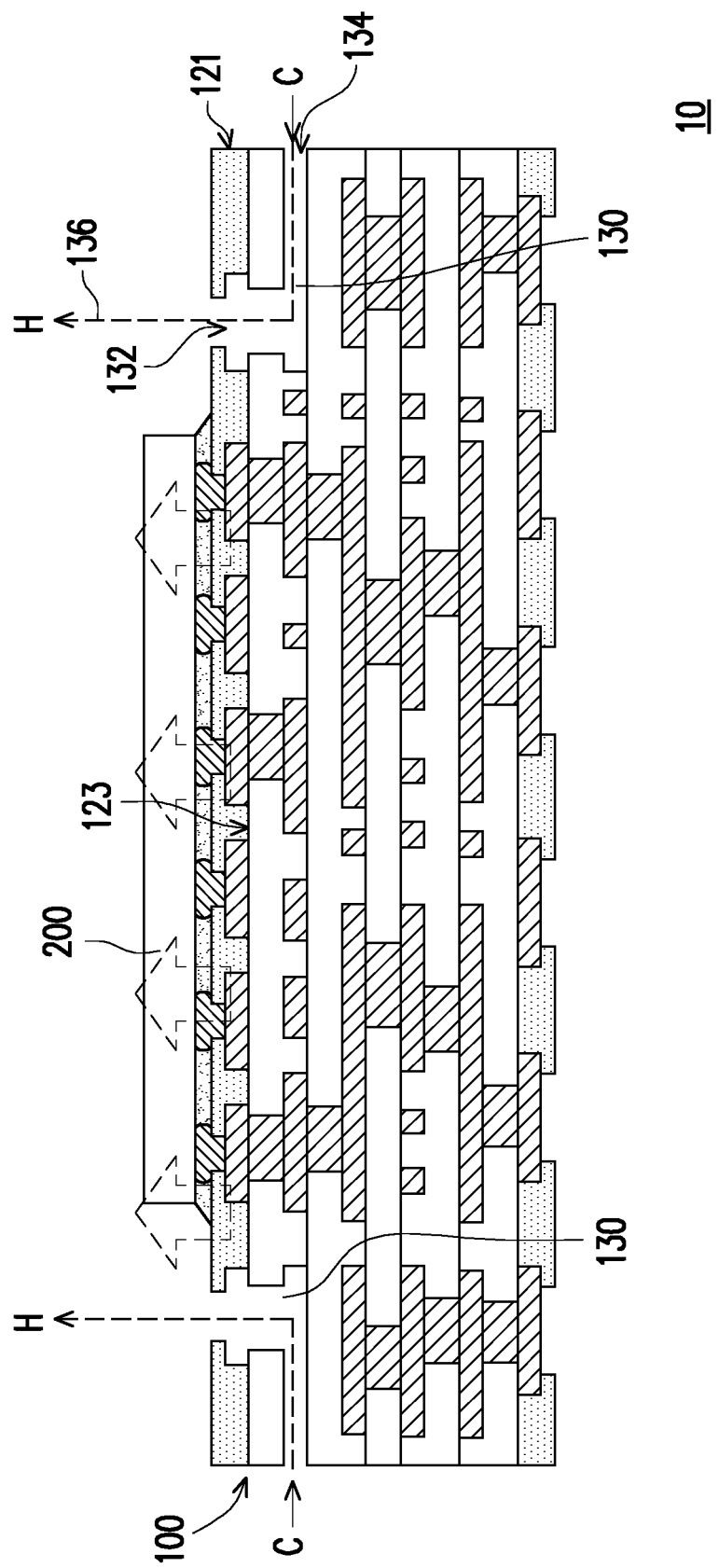
FIG. 2C is a schematic cross-sectional view showing a heat dissipation path of the chip package structure in FIG. 2A.

FIG. 2A is a schematic cross-sectional view showing a chip package structure according to an embodiment of the disclosure. FIG. 2B is a schematic top view of the chip package structure in FIG. 2A. FIG. 2C is a schematic cross-sectional view showing a heat dissipation path of the chip package structure in FIG. 2A.

Referring to both of FIG. 2A and FIG. 2B, in the embodiment, a chip package structure 10 includes the heat dissipation substrate 100 and a chip 200. The chip 200 is disposed on the first build-up circuit structure 120 of the heat dissipation substrate 100. Specifically, the chip 200 is adhered to and fixed in the chip disposing area A on the first build-up circuit structure 120 by an adhesive layer 220. The chip 200 includes a plurality of solder balls 210. The chip 200 may be electrically connected to the first patterned conductive layer 126 through the solder ball 210.

Next, referring to FIG. 2B and FIG. 2C, in the embodiment, the heat dissipation channel 130 (shown schematically as twenty in FIG. 2B) and the first opening 132 thereof are disposed around the chip 200 as a thermal cycle channel of the chip package structure 10. Specifically, when the heat generated during the operation of the chip 200 and the heat dissipation channel 130 in the heat dissipation substrate 100 generate a chimney effect, the hot air H discharged along a heat dissipation path 136 and the cold air C outside can be formed into a circulation system, thereby improving the heat dissipation performance of the chip 200 and the heat dissipation substrate 100 to prevent a large amount of heat energy from being accumulated in the chip 200 and the heat dissipation substrate 100.

In summary, according to the disclosure, in the heat dissipation substrate, the manufacturing method thereof and the chip package structure, the heat dissipation substrate includes the heat dissipation channel, and the heat dissipation channel is disposed around the chip disposing area. Specifically, the heat dissipation channel has the first opening and the second opening. The first opening penetrates through the first dielectric layer, the second opening is disposed on a side surface of the first build-up circuit structure, and the first opening is in communication with the second opening. The design makes the heat generated during the operation of the chip and the heat dissipation channel in the heat dissipation substrate generate a chimney effect, thereby improving the heat dissipation efficiency of the heat dissipation substrate.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A heat dissipation substrate, comprising:
an inner circuit structure;
a first build-up circuit structure, disposed on the inner circuit structure, and comprising an interlayer dielectric layer, at least one first dielectric layer, at least one first patterned conductive layer and a plurality of first conductive vias, wherein the first conductive vias penetrate through the interlayer dielectric layer and the first dielectric layer, the first patterned conductive layer and the first dielectric layer are sequentially stacked on the interlayer dielectric layer, and the at least one first patterned conductive layer is electrically connected to the inner circuit structure through the first conductive vias; and
at least one heat dissipation channel, disposed around a chip disposing area on the first build-up circuit structure, and having a first opening and a second opening, wherein the first opening penetrates through the at least one first dielectric layer and exposes a portion of the interlayer dielectric layer, the second opening is disposed on a side surface of the first build-up circuit structure, and the first opening is in communication with the second opening.

2. The heat dissipation substrate as recited in claim 1, wherein the at least one heat dissipation channel extends from a first surface of the first build-up circuit structure relatively far away from the inner circuit structure to the side surface of the first build-up circuit structure.

3. The heat dissipation substrate as recited in claim 1, further comprising:
   a first patterned solder resist layer, at least disposed on a first surface of the first build-up circuit structure relatively far away from the inner circuit structure.

4. The heat dissipation substrate as recited in claim 1, wherein the inner circuit structure comprises a core layer, a first patterned circuit layer, a second patterned circuit layer and at least one conductive via, wherein the core layer has an upper surface and a lower surface opposite to each other, the first patterned circuit layer is disposed on the upper surface, the second patterned circuit layer is disposed on the lower surface, and the conductive via connects the first patterned circuit layer and the second patterned circuit layer.

5. The heat dissipation substrate as recited in claim 4, further comprising:
   a second build-up circuit structure, disposed on the lower surface of the core layer and covering the second patterned circuit layer; and
   a second patterned solder resist layer, disposed on a second surface of the second build-up circuit structure relatively far away from the inner circuit structure.

6. The heat dissipation substrate as recited in claim 5, wherein the second build-up circuit structure comprises at least one second dielectric layer, at least one second patterned conductive layer and at least one second conductive via, wherein the at least one second conductive via penetrates through the at least one second dielectric layer, and the second dielectric layer and the second patterned conductive layer are sequentially stacked on the lower surface of the inner circuit structure, and the second patterned conductive layer is electrically connected to the inner circuit structure through the second conductive via.

7. A chip package structure, comprising:
   the heat dissipation substrate according to any one of claim 1; and
   a chip, disposed on the first build-up circuit structure of the heat dissipation substrate and disposed in the chip disposing area, wherein the chip comprises a plurality of solder balls, and the chip is electrically connected to the at least one first patterned conductive layer through the solder balls.

8. A manufacturing method of a heat dissipation substrate, comprising:
   providing an inner circuit structure;
   performing a build-up process to laminate a first build-up circuit structure onto the inner circuit structure, wherein the first build-up circuit structure comprises an interlayer dielectric layer, at least one first dielectric layer, at least one a first patterned conductive layer and a plurality of first conductive vias, wherein the first conductive vias penetrate through the interlayer dielectric layer and the first dielectric layer, the first patterned conductive layer and the first dielectric layer are sequentially stacked on the interlayer dielectric layer, and the at least one first patterned conductive layer is electrically connected to the inner circuit structure through the first conductive vias; and
   removing a portion of the at least one first patterned conductive layer and the first conductive vias to form at least one heat dissipation channel, wherein the at least one heat dissipation channel is disposed around a chip disposing area on the first build-up circuit structure and has a first opening and a second opening, wherein the first opening penetrates through the at least one first dielectric layer and exposes a portion of the interlayer dielectric layer, the second opening is disposed on a side surface of the first build-up circuit structure, and the first opening is in communication with the second opening.

9. The manufacturing method of the heat dissipation substrate as recited in claim 8, wherein the at least one heat dissipation channel extends from a first surface of the first build-up circuit structure relatively far away from the inner circuit structure to the side surface of the first build-up circuit structure.

10. The manufacturing method of the heat dissipation substrate as recited in claim 8, wherein the step of removing the portion of the at least one first patterned conductive layer and the first conductive vias comprises performing an etching process to a periphery of the chip disposing area.

11. The manufacturing method of the heat dissipation substrate as recited in claim 8, after performing the build-up process to laminate the first build-up circuit structure onto the inner circuit structure, the method further comprises:
   forming a first patterned solder resist layer at least on a first surface of the first build-up circuit structure relatively far away from the inner circuit structure.

12. The manufacturing method of the heat dissipation substrate as recited in claim 8, wherein the inner circuit structure comprises a core layer, a first patterned circuit layer, a second patterned circuit layer, and a conductive via, wherein the core layer has an upper surface and a lower surface opposite to each other, the first patterned circuit layer is disposed on the upper surface, the second patterned circuit layer is disposed on the lower surface, and the conductive via connects the first patterned circuit layer and the second patterned circuit layer.

13. The manufacturing method of the heat dissipation substrate as recited in claim 12, further comprising:
   while performing the build-up process, simultaneously laminating a second build-up circuit structure onto the second patterned circuit layer; and
   forming a second patterned solder resist layer on a second surface of the second build-up circuit structure relatively far away from the inner circuit structure.

14. The manufacturing method of the heat dissipation substrate as recited in claim 13, wherein the second build-up circuit structure comprises at least one second dielectric layer, at least one second patterned conductive layer and at least one second conductive via, wherein the second conductive via penetrates through the second dielectric layer, and the second dielectric layer and the second patterned conductive layer are sequentially stacked on the lower surface of the core layer, and the second patterned conductive layer is electrically connected to the second patterned circuit layer through the second conductive via.

* * * * *